United States Patent [19]

Okanobu

[11] Patent Number: 4,965,528
[45] Date of Patent: Oct. 23, 1990

[54] CROSS-COUPLED DIFFERENTIAL AMPLIFIER

[75] Inventor: Taiwa Okanobu, Tokyo, Japan

[73] Assignee: Sony Corporation, Tokyo, Japan

[21] Appl. No.: 379,110

[22] Filed: Jul. 13, 1989

[30] Foreign Application Priority Data

Jul. 18, 1988 [JP] Japan .................................. 63-178765
Jul. 21, 1988 [JP] Japan .................................. 63-182615

[51] Int. Cl.⁵ .................................................... H03F 3/45
[52] U.S. Cl. ........................................ 330/252; 330/261
[58] Field of Search ............... 330/252, 254, 258, 261, 330/296

[56] References Cited

U.S. PATENT DOCUMENTS 3,445,780  5/1969  Beelitz ............................. 330/252 X
3,812,434  5/1974  Lommers et al. ................... 330/252

FOREIGN PATENT DOCUMENTS 0190974  8/1986  European Pat. Off. ............. 330/252

Primary Examiner—Steven Mottola
Attorney, Agent, or Firm—Alvin Sinderbrand

[57] ABSTRACT

An amplifier has first and second differential amplifier circuits connected in parallel for improving the distortion ratio characteristic and the like, with the first differential amplifier circuit including first and second transistors connected in common at respective emitters to a first constant current source, and the second differential amplifier circuit including third and fourth transistors connected in common at respective emitters to a second constant current source. The first differential amplifier circuit has a collector current ratio of 1:N, while the second differential amplifier circuit has a collector current ratio of N:1, with N being in the range between approximately 2.5 and 6, preferably being $2+3^{\frac{1}{2}}$.

11 Claims, 5 Drawing Sheets

CROSS-COUPLED DIFFERENTIAL AMPLIFIER

BACKGROUND OF THE INVENTION

1. Field Of The Invention

The present invention relates to an amplifier, and more particularly, to an amplifier having a plurality of differential amplifier circuits configured for improving the distortion ratio and other amplifier characteristics.

2. Description of the Prior Art

As shown in FIG. 1, a typical prior-art amplifier 10 includes a transistor Qa which receives, at its base, an input signal voltage from a signal source 12. The transistor Qa is connected at its emitter to ground through a resistor Re and an amplified output signal is produced at its collector.

In general, the base-emitter voltage versus base current (collector current) characteristic of a transistor is exponential. Therefore, in the case of the amplifier shown in FIG. 1 when the input signal is large in amplitude, the distortion of the output current becomes large. In order to expand the input dynamic range and thereby reduce the distortion, the amplifier input may be connected with the resistor Re for establishing a current negative feedback path. However, when the output impedance Rg of the signal source 12 is low and the resistor Re is connected to the amplifier input, the noise (thermal disturbance noise) generated from the resistor Re causes the noise factor NF to deteriorate. Further, because a signal voltage is produced across the resistor Re, the DC voltage at the emitter of the transistor Qa must be correspondingly increased. Thus, the power source voltage has to be increased. As a result, the prior-art amplifier is not suitable for use with an integrated circuit (IC) for a radio receiver driven by a single size AA battery.

In order to reduce the noise generated from the resistor Re, a smaller resistance value for the resistor Re may be used, and, as a result thereof, the signal voltage decreases. However, if the resistance value of the resistor Re is reduced, the amount of negative feedback current is also undesirably reduced. For avoiding a reduction of the negative feedback current, the collector current of the transistor Qa may be increased, but that causes an undesirable increase in the power consumption.

The distortion may be minimized by selecting the resistance value of the resistor Re and the operation point of the transistor Qa so that the resistance value of the resistor Re is ½ the emitter resistance value Re of the transistor Qa. However, the operation point of transistor Qa will fluctuate when the input signal voltage is large, thereby precluding direct connection of the transistor Qa to a transistor at a next stage.

As a result of the above-described difficulties, the prior-art amplifier is not suitable for fabrication as an integrated circuit.

OBJECTS AND SUMMARY OF THE INVENTION

Accordingly, it is an object of the present invention to provide an improved amplifier which can overcome the abovedescribed problems associated with the prior art.

More specifically, it is an object of the present invention to provide an amplifier having an improved distortion ratio characteristic.

It is another object of the present invention to provide an amplifier in which the consumed current is reduced.

It is still another object of the present invention to provide an amplifier which can be fabricated as an integrated circuit (IC).

It is a further object of the present invention to provide an amplifier in which the cross modulation characteristic, the spurious characteristic and the like are improved.

It is a still further object of the present invention to provide an amplifier having an improved signal-to-noise (S/N) ratio.

It is yet another object of the present invention to provide an amplifier for use with an automatic gain control (AGC) circuit to carry out the automatic gain control over a wide range.

In accordance with an aspect of the invention, an amplifier comprises first and second differential amplifier circuits, with the first differential amplifier circuit having the emitters of first and second transistors connected in common to a first constant current source, and the second differential amplifier circuit having the emitters of third and fourth transistors connected in common to a second constant current source. The bases of the first and third transistors are connected together as are the bases of the second and fourth transistors. In addition, the collectors of the first and third transistors are connected together, while the collectors of the second and fourth transistors also are connected together. The ratio of the collector current of the first transistor to the collector current of the second transistor, and the ratio of the collector current of the fourth transistor to the collector current of the third transistor are both selected to be 1:N, with N being in the range approximately between 2.5 and 6, and being preferably $2+3^{\frac{1}{2}}$. An input signal voltage of one polarity is applied to the bases of the first and third transistors and an input signal voltage of the opposite polarity is applied at the bases of the second and fourth transistors. Output signal currents are derived from at least one of the collectors of the first and third transistors and from at least one of the collectors of the second and fourth transistors.

In accordance with another aspect of the present invention, the first and second differential amplifier circuits are connected in parallel with fifth and sixth transistors having their emitters connected in common to a third constant current source and seventh and eighth transistors having their emitters connected in common to a fourth constant current source. The bases and collectors of the fifth and seventh transistors are connected in common to the bases of the first and third transistors and the bases and collectors of the sixth and eighth transistors are connected in common to the bases of the second and fourth transistors. The ratio between the collector current of the first transistor and the collector current of the second transistor, and the ratio between the collector current of the fourth transistor and the collector current of the third transistor are again selected to be 1:N (where N is approximately $2+3^{\frac{1}{2}}$ or N ranges approximately from 2.5 to 6). Further, the ratio between the collector current of the fifth transistor and the collector current of the sixth transistor, and the ratio between the collector current of the eighth transistor and the collector current of the seventh transistor are selected to be 1:n (where n is approximately $2+3^{\frac{1}{2}}$ or n ranges approximately from 2.5 to 6). An input signal voltage of one polarity is applied to the bases of the first and third transistors and an input signal voltage of the opposite polarity is applied at the bases of the second and fourth transistors. At least the currents of the third and fourth constant current sources are controlled in accordance with an automatic gain control (AGC) voltage so that an output signal current having its gain automatically controlled is derived from at least one of the collectors of the first and third transistors and at least one of the collectors of the second and fourth transistors.

DETAILED DESCRIPTION OF THE PREFERRED EMBODIMENTS

Figure 2:
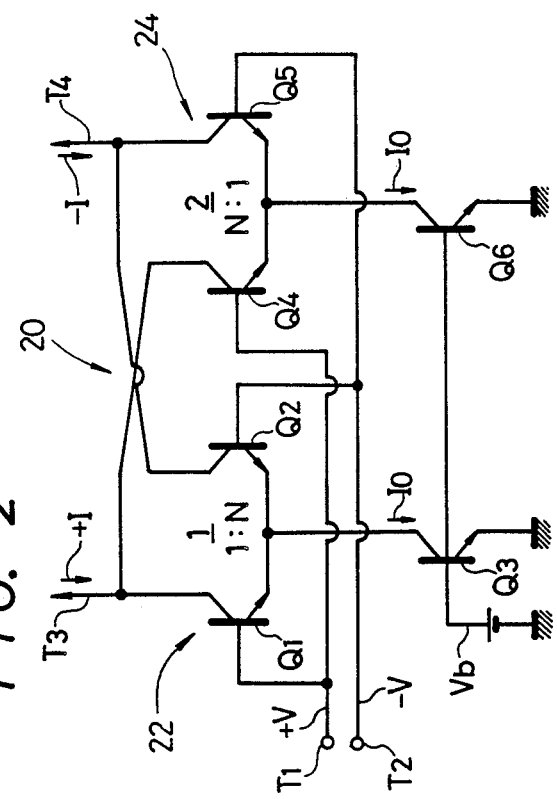
FIG. 2 is a schematic diagram showing an amplifier according to an embodiment of the present invention.

Referring now to FIG. 2, it will be seen that an amplifier 20 according to an embodiment of the present invention includes first and second differential amplifier circuits 22 and 24. The first differential amplifier circuit 22 includes transistors Q1, Q2, and Q3, while the second differential amplifier circuit 24 includes transistors Q4, Q5 and Q6. In the first differential amplifier circuit 22, the base of transistor Q1 receives a voltage signal $+V$ through an input terminal T1, whereas the base of transistor Q2 receives a voltage signal $-V$ through an input terminal T2. The voltage signal $+V$ is equal in magnitude and opposite in polarity to the voltage signal $-V$. The emitters of transistors Q1 and Q2 are connected in common to ground through the transistor Q3. The base of the transistor Q3 is supplied with a bias voltage Vb such that the collector-emitter path of the transistor Q3 serves as a constant current source.

In the second differential amplifier circuit 24, the base of transistor Q4 receives the voltage signal $+V$ through the input terminal T1, while the base of transistor Q5 receives the voltage signal $-V$ through the input terminal T2. Similarly, the emitters of transistors Q4 and Q5 are connected in common to ground through a transistor Q6 which has its base supplied with the bias voltage Vb so that the collector-emitter path of the transistor Q6 serves as another constant current source.

The ratio between the base-emitter junction areas of transistors Q1 and Q2, respectively, and the ratio between the base-emitter junction areas of transistors Q5 and Q4, respectively, are selected to each be 1:N. As a result, the base-emitter voltages of transistors Q1 and Q5, and of transistors Q2 and Q4 are made equal, and the ratio between the collector currents of transistors Q1 and Q2, respectively, and the ratio between the collector currents of transistors Q5 and Q4, respectively, are caused to each be 1:N. Preferably, transistors Q3 and Q6 are selected to have the same electrical characteristics.

The outputs of amplifier 20 are provided at terminals T3 and T4. The collectors of transistors Q1 and Q4 are connected in common to the output terminal T3, while the collectors of transistors Q2 and Q5 are connected in common to the output terminal T4.

As is apparent in FIG. 2, the differential amplifier circuits 22 and 24 are connected in parallel between the input terminals T1 and T2 and the output terminals T3 and T4. The ratio between the collector currents of transistors Q1 and Q5 and the ratio between the collector currents of transistors Q2 and Q4 are opposite in sign to product output signal currents $\pm I$ at the respective terminals T3 and T4, which are equal in amplitude and opposite in phase. As a result, even when the amplifier circuits 22 and 24 generate even-numbered higher order harmonic distortions, the distortions are significantly reduced by a cancelling out in the output signal currents $\pm I$. In addition, when the ratio N of the collector currents is properly selected, the ternary higher harmonic distortions in the output signal currents $\pm I$ also are significantly reduced.

The equation for the current I in the amplifier 20 of FIG. 2, is as follows:

$$I = I_0 \exp(K/V)/\{1 + \exp(K/V)\}$$

where $I_0 = $ the collector current of each of the transistors Q3 and Q6; and $K = q/(KT)$, from the second order differentiation value of the input signal voltage versus output signal current characteristic in which the ternary higher harmonic distortion is generated.

The second order differentiation valve is expressed as follows:

$$d^2qm/dV^2 = (K^3 I_0) \frac{1 - 4\exp(KV) + \{\exp(KV)\}^2}{\{1 + \exp(KV)\}^4}$$

where qm is the mutual conductance. The minimum distortion, that is, $d^2qm/dV^2=0$, occurs when $\exp(K/V)=2+3^{\frac{1}{2}}$. Thus, the value $N=2+3^{\frac{1}{2}}$ causes the ternary higher harmonic distortion to be a minimum.

Figure 3:
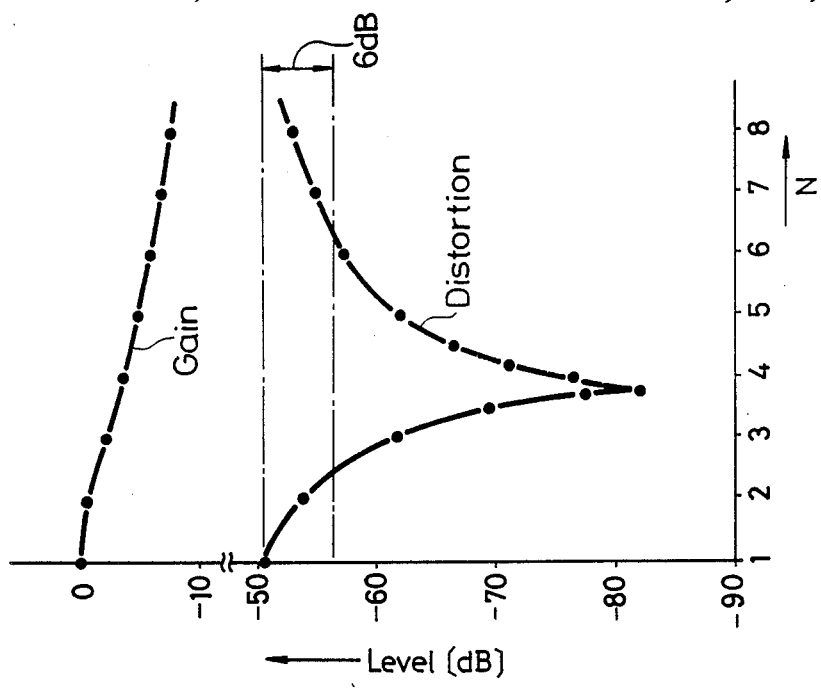
FIG. 3 is a graph showing the computer generated relationship between a ratio N and the level of all higher harmonic distortions.
Figure 1:
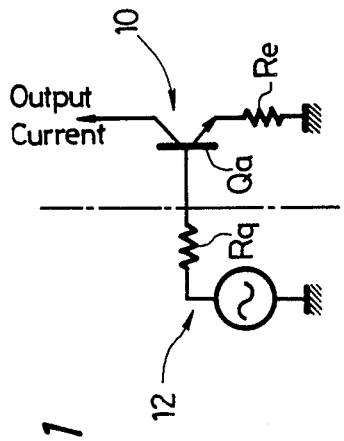
FIG. 1 is a schematic diagram of a prior-art amplifier.

FIG. 3 is a computer generated characteristic graph showing the relationship between the ratio N and the higher order harmonic distortion. The characteristic of an ordinary differential amplifier is represented on the graph where N=1. The amount of distortion for N=2+3^½ is shown to be more than 30 dB lower then that for an ordinary differential amplifier. Hence, the distortion characteristic is improved considerably.

Figure 4:
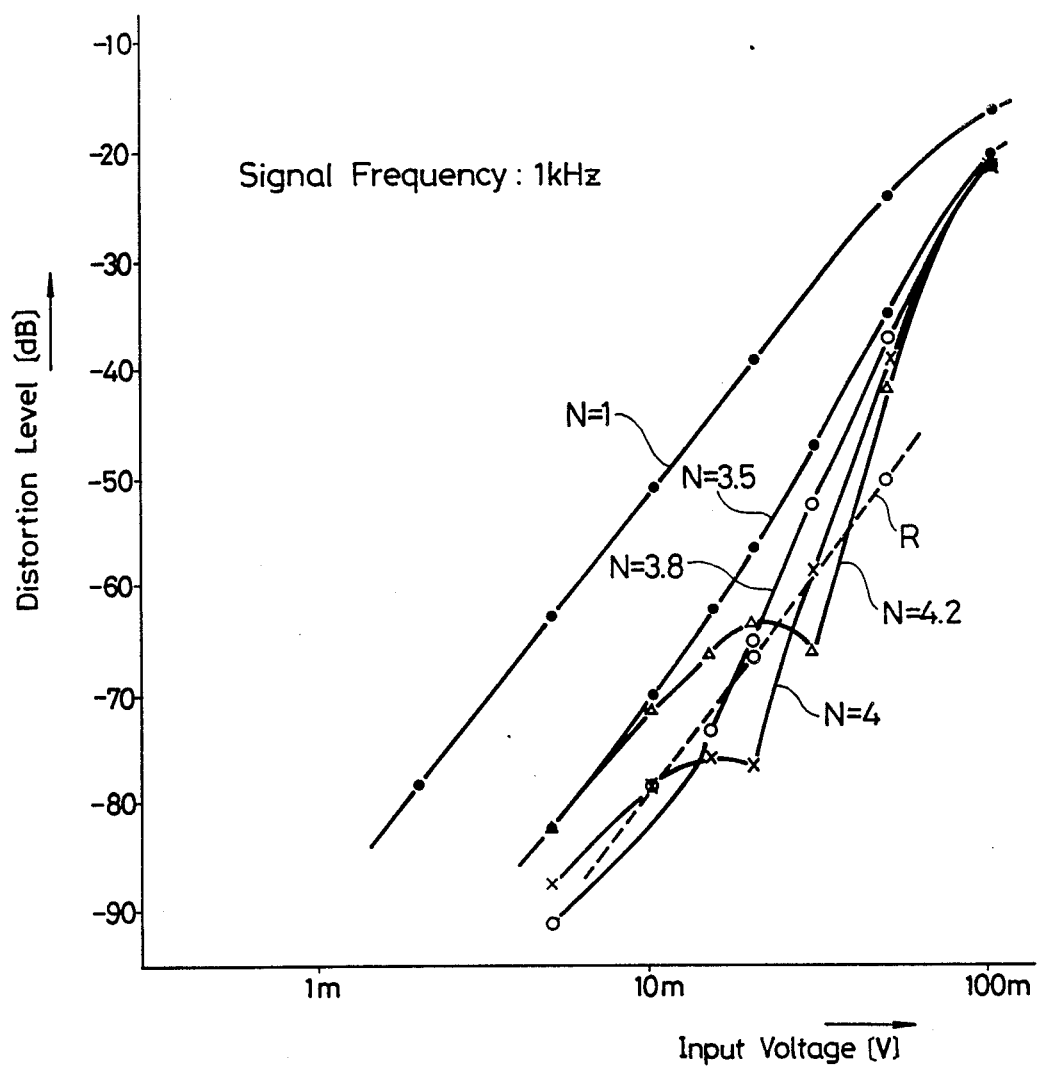
FIG. 4 is a graph showing the computer generated relationship between the input signal voltage and the level of all higher harmonic distortions for various values of N.

FIG. 4 is a characteristic graph showing the relationship between the input signal voltage V and the higher order harmonic distortions for various values of the ratio N. A broken line R shows the characteristic of an ordinary differential amplifier in which, for comparison, a resistor of 500 ohms is used to provide a constant current source.

According to the graph of FIG. 4, when N=2+3^½ the distortion is reduced substantially below the distortion of a standard differential amplifier represented by the line labeled N=1, regardless of whether the amplitude of the input signal voltage is large or small. It is to be noted that the amount of distortion is increasingly reduced as the ratio N approaches the equality N=2+3^½.

If the amount of distortion is ½ of, or -6 dB less than, the distortion for the standard differential amplifier (where N=1), the distortion ratio is substantially improved. From the graph of FIG. 3, it will be seen that a value for N approximately ranging between 2.5 and 6 results in such 6 dB reduction in the distortion level. If the ratio N is selected within such range, the distortion amount is less than ½ (less than - 6 dB) as compared with the standard differential amplifier, and the distortion ratio characteristic is improved. Thus, by selecting the ratio 1:N between the collector currents of transistors Q1 and Q2 and the ratio 1:N between the collector currents of transistors Q5 and Q4 on the basis of a value for N ranging between approximately 2.5 and 6, the distortion ratio characteristic can be improved considerably.

Because current negative feedback through the emitter resistor is not used to reduce the distortion in accordance with the present invention, the noise factor NF is not deteriorated by the emitter resistor. As a result, a voltage drop across the emitter resistor will not impact the amplifier performance. In addition, because the collector-emitter voltage of the transistors Q3 and Q6 is low, for example, is about 0.2V, the amplifier embodying the present invention can be operated sufficiently by a voltage source of only about 0.9V which is 60% of the rated voltage 1.5V of the size AA dry cell battery.

Because the ratio between the collector currents of transistors Q1 and Q2 and the ratio between the collector currents of transistors Q5 and Q4 are each 1:N and because the absolute amount of collector current need not be increased, the consumed current can be reduced.

Furthermore, because the operation points of the transistors Q1, Q2, Q4 and Q5 do not fluctuate upon changes in the level of the input signal, the amplifier 20 embodying the present invention can be connected directly with a transistor in a succeeding stage and can be fabricated as an integrated circuit.

In the above described embodiment, the ratio between the base-emitter junction areas of transistors Q1 and Q2 and the ratio between the base-emitter junction areas of transistors Q5 and Q4 are both selected to be 1:N so that the corresponding ratios between the collector currents are also 1:N, with N preferably being 2+3^½.

Figure 5:
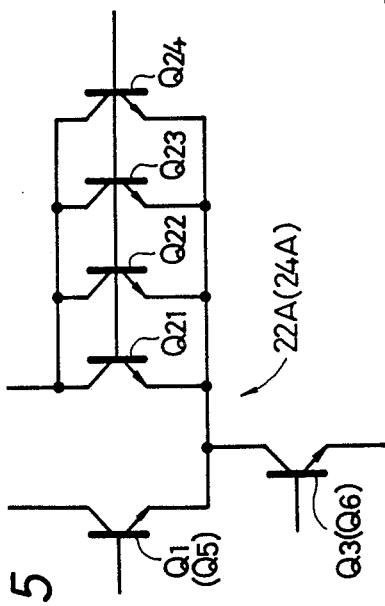
FIG. 5 is a schematic diagram showing a main portion of an amplifier according to another embodiment of the present invention.
Figure 6:
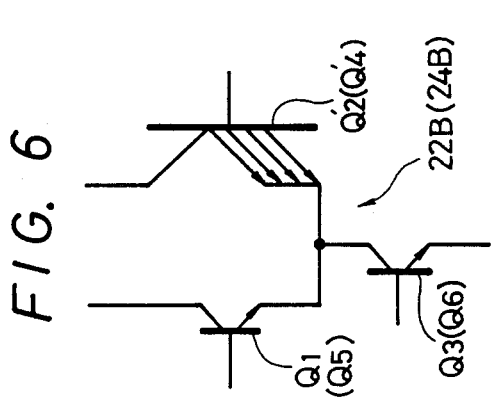
FIG. 6 is a schematic diagram showing a main portion of an amplifier according to still another embodiment of the present invention.

FIGS. 5 and 6 show respective embodiments of the invention in which N=4, which approximates N=2+3^½.

In the embodiment shown in FIG. 5, each of the differential amplifier circuits 22A and 24A includes transistors Q21, Q22, Q23 and Q24, each having substantially the same electrical characteristics as that of the transistor Q1 (or Q5), and being connected in parallel in place of the transistor Q2 (or Q4), to establish N=4. The differential amplifier circuits 22A and 24A are connected to each other similarly to the circuits 22 and 24 in FIG. 2.

In the embodiment of FIG. 6, each of the differential amplifier circuits 22B and 24B has four emitter regions formed in the base region of a transistor Q'2 (or Q'4) which replaces the transistor Q2 (or Q4) in FIG. 2. Each of the four emitter regions of the transistor Q'2 (or Q'4) is the same size as the emitter region of the transistor Q1 (or Q5). The four emitters of the transistor Q'2 (or Q'4) are connected together to establish N=4. Once again, the differential amplifier circuits 22B and 24B are connected to each other similarly to the circuits 22 and 24 in FIG. 2.

Figure 7:
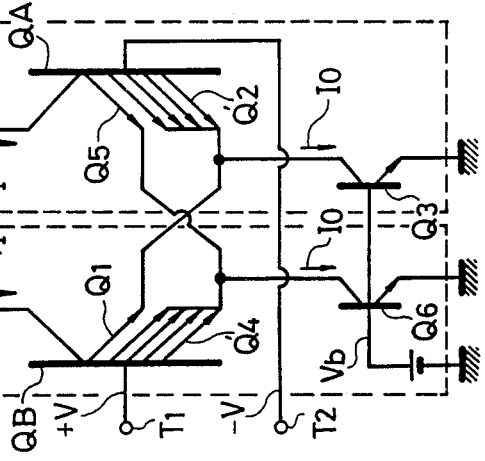
FIG. 7 is a schematic diagram of an amplifier according to yet another embodiment of the present invention.

FIG. 7 shows another embodiment of the present invention in which differential amplifier circuits 22C and 24C include transistors QB and QA, each having five emitter regions of the same size formed in their base regions. Four of the five emitter regions of the transistors QA and QB are connected together to form the transistors Q'2 and Q'4, respectively, while the remaining emitter regions of the transistors QA and QB are used to form the transistors Q5 and Q1, respectively.

Figure 8:
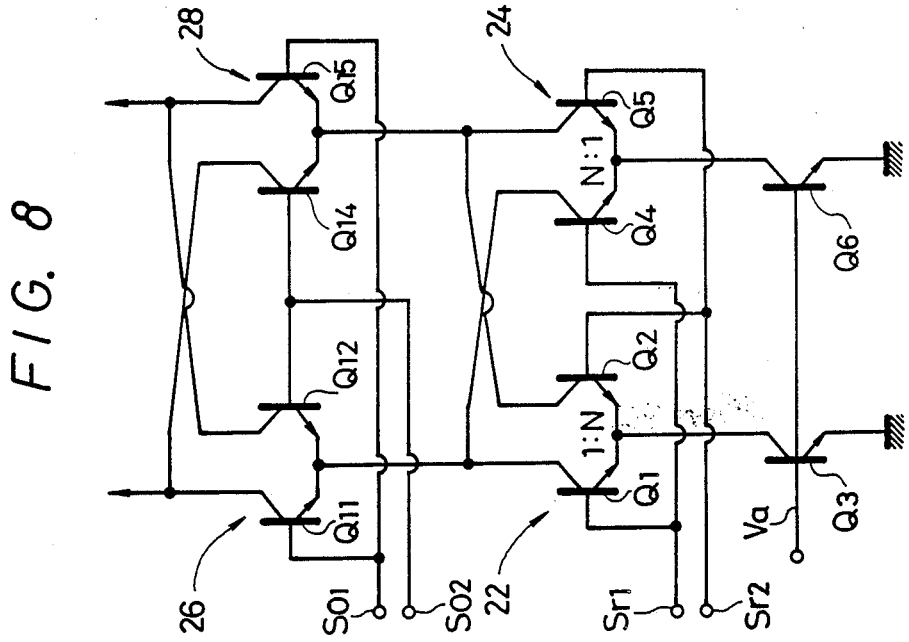
FIG. 8 is a schematic diagram of an amplifier embodying the present invention as applied to a mixer circuit of a radio receiver.

As shown on FIG. 8, an amplifier embodying the present invention can be employed as a mixer or multiplier circuit of a radio receiver. In such case, two additional differential amplifier circuits 26 and 28 are connected to the differential amplifier circuits 22 and 24 previously described with reference to FIG. 2. Differential amplifier circuit 26 includes transistors Q11 and Q12 which have their emitters connected in common to the collectors of transistors Q1 and Q4. Differential amplifier circuit 28 includes transistors Q14 and Q15 which have their emitters connected in common to the collectors of transistors Q2 and Q5. As illustrated, the differential amplifiers 26 and 28 are connected in a balanced-type configuration.

Local oscillation signals $S_{o1}$ and $S_{o2}$ are input to the differential amplifier circuits 26 and 28. More specifically, the signal $S_{o1}$ is input to the bases of transistors Q11 and Q15, while the other signal $S_{o2}$, equal in magnitude and opposite in phase to the signal $S_{o1}$, is input to the bases of transistors Q12 and Q14. Similarly, a signal Sr1 (containing a bias voltage) of one polarity is input to the bases of transistors Q1 and Q4, while a signal Sr2 of the opposite polarity is input to the bases of the transistors Q2 and Q5. An automatic gain control (AGC) voltage Va (containing a bias voltage) is applied to the bases of the transistors Q3 and Q6. Intermediate frequency current signals (multiplied output signals) which are opposite in phase are derived from the collectors of transistors Q11 and Q14 and from the collectors of transistors Q12 and Q15, respectively.

Once again, since a current negative feedback by way of the emitter resistor is not needed in the circuit of FIG. 8 for reducing distortion, the noise factor NF is not deteriorated. Thus, it is not necessary to consider the voltage drop across on emitter resistor. In addition, because the collector-emitter voltage of each of the transistors Q3 and Q6 is about 0.2V, the circuit can be readily driven by a power source voltage of about 0.9 V which is only about 60% of the rated voltage 1.5V of the size AA dry cell battery.

An AGC circuit for use with a radio receiver will now be described with reference to FIG. 9, in which an antenna tuning circuit 30 and a differential amplifier circuit 32 are shown. The differential amplifier circuit 32 includes transistors Qa and Qb for providing differential amplification, and a transistor Qc for providing a constant current source. Also provided are diodes Da and Db for shunting and a transistor Qd for controlling the diodes Qa and Qb. The transistor Qd receives an AGC voltage Va at its base.

Figure 9:
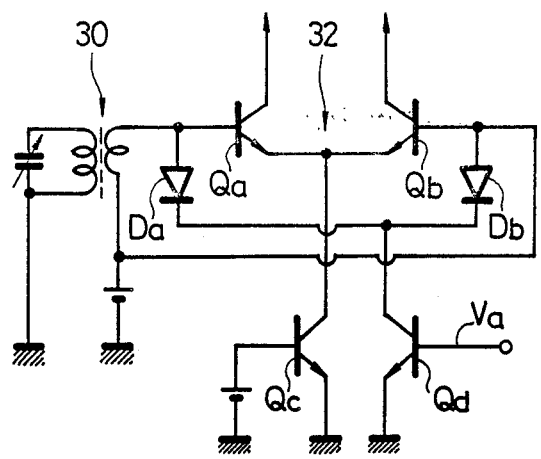
FIG. 9 is a schematic diagram of an automatic gain control (AGC) circuit for use with a radio receiver.

In operation of the circuit shown on FIG. 9, a desired broadcast signal is selected by the antenna tuning circuit 30. The selected signal is input to the differential amplifier circuit 32 at the bases of transistors Qa and Qb. The signal is amplified in circuit 32 for, producing a current output signal at the collectors of transistors Qa and Qb. In order to control the gain of the differential amplifier circuit 32, the collector current of transistor Qd is changed in response to the AGC voltage signal Va. The impedances of the diodes Da and Db are changed in accordance with the collector current of transistor Qd. Hence, the desired broadcast signal received from the tuning circuit 30 is variably shunted by the diodes Da and Db so that the gains for the collector currents of transistors Qa and Qb are automatically controlled.

Alternatively, the diodes Da and Db and the transistors Qa and Qb may be considered a current mirror circuit, with diodes Da and Db being the input side of such mirror circuit. Accordingly, when the collector currents of the transistors Qc and Qd are equal, the signal current flowing through the diodes Da and Db is equal to the signal current flowing through the collectors of transistors Qa, Qb, making the current gain equal to unity. However, when the collector currents of transistors Qc and Qd are different, the ratio of the signal current flowing through the diodes Da and Db to the signal current flowing through the collectors of transistors Qa and Qb is the same as the ratio between the collector currents of transistors Qd and Qc, respectively. Thus, the current gain is automatically controlled to follow the ratio between the collector currents of transistors Qc and Qd.

In general, the forward voltage versus forward current characteristic of a diode, and the base-emitter voltage versus the base current (collector current) characteristic of a transistor are non-linear exponential characteristics. As a result, when the voltage across the diodes Da and Db in the AGC circuit of FIG. 9 is increased to more than about 10 mV, the non-linear characteristic of such voltage causes deterioration of the cross modulation characteristic, the spurious characteristic and the like.

Figure 10:
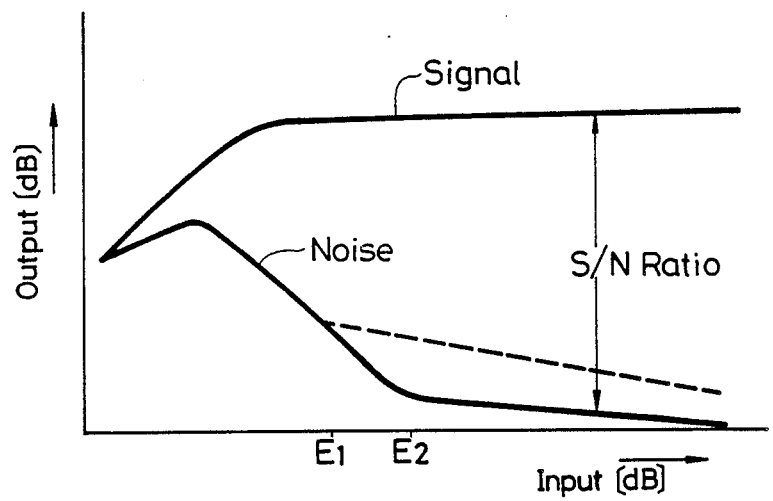
FIG. 10 is a graph used to explain problems encountered with the AGC circuit shown in FIG. 9.

In order to reduce the above-mentioned defects in the AGC circuit of FIG. 9, the AGC has to be effective even for an input level where the voltage across the diodes Da and Db is 10 mV. More specifically, as shown in FIG. 10, the AGC has to be effective for a relatively small input level $E_1$ which corresponds to a voltage across the diodes Da and Db of 10 mV, so that the level of the detected output becomes constant. Simultaneously, it is necessary to keep the voltage across the diodes Da and Db from exceeding 10 mV.

Under such conditions, the input level, though small, is limited by the AGC operation. Therefore, the gain of a rear stage has to be increased and, as a result, the noise level of the output signal (detected output) takes on the characteristic represented by a dashed line in FIG. 10. In the case of an AM radio receiver, the maximum signal-to-noise (S/N) ratio deteriorates. Thus, the disturbance characteristic and the S/N ratio are incompatible in an AGC circuit as shown in FIG. 9.

An AGC circuit according to an embodiment of the present invention which can solve the above problem of the AGC circuit of FIG. 9 will now be described with reference to FIG. 11, in which differential amplifiers circuits 22 and 24 are formed as described earlier in respect to FIG. 2. A signal voltage of a broadcast wave from the tuning circuit 30 is applied to the bases of transistors Q1 and Q4 with one polarity and to the bases of transistors Q2 and Q5 with the opposite polarity. The AGC voltage Va is supplied through a terminal T5 to the bases of transistors Q3 and Q6. A constant current source transistor Q13 is connected between ground and the emitters of transistors Q11 and Q12 of a differential amplifier circuit 26'. The base and collector of the transistor Q11 are connected in common to the bases of transistors Q1 and Q4, while the base and collector of transistor Q12 are connected in common to the bases of transistors Q2 and Q5. An AGC voltage Vd is input to the base of transistor Q13 through a terminal T6. Another constant current source transistor Q16 is connected between ground and the connected together emitters of transistors Q14 and Q15 of a differential amplifier circuit 28'. The base and collector of the transistor Q14 are also connected in common to the bases of the transistors Q1 and Q4, and the base and collector of the transistor Q15 are connected in common to the bases of the transistors Q2 and Q5. Finally, the base of the transistor Q16 is connected to the terminal T6 for receiving the AGC voltage Vd therefrom.

When the base-emitter voltages of transistors Q11, Q12 and transistors Q14, Q15 are equal, the ratio between the collector currents of transistors Q11 and Q12 and the ratio between the collector currents of transistors Q15 and Q14 each become 1:n, where the ratio n is similar to the ratio N discussed previously. In fact, in the embodiment of FIG. 11, n=N. Accordingly, the signal voltage of the broadcast wave from the tuning circuit 30 is amplified by the differential amplifiers 22 and 24 resulting in output currents ± I at the output terminals T3 and T4, respectively.

In order to perform automatic gain control, the collector currents of the transistors Q3 and Q6 are controlled by the AGC voltage Va. Further, since the transistors Q11, Q12, Q14 and Q15 are connected in diode-fashion, the impedances of the transistors Q11, Q12, Q14 and Q15 are changed in accordance with the AGC voltage Vd, in effect providing a shunt for the AGC circuit.

Alternatively, the transistors Q11 and Q14 and the transistors Q1 and Q4 may be considered a current mirror circuit and the transistors Q12 and Q15 and the transistors Q2 and Q5 may be considered another current mirror circuit. The ratios between the collector currents of the input side transistors Q11 and Q12, and between the collector currents of the input side transistors Q15 and Q14, and the ratios between the collector currents of the output side transistors Q1 and Q2, and between the collector currents of the output side transistors Q5 to Q4, change in response to the AGC voltage Vd, thereby changing the current gain. Because the linearity of each of the differential amplifiers 22 and 24 is satisfactory for an input signal ranging from a small amplitude to a large amplitude as described above and because the transistors Q11 to Q16 constitute a differential amplifier in the same manner as the transistors Q1 to Q6 constitute the differential amplifiers 22 and 24, the AGC circuit of this embodiment can effect AGC with good linearity for an input signal ranging from a small amplitude to a large amplitude.

Figure 11:
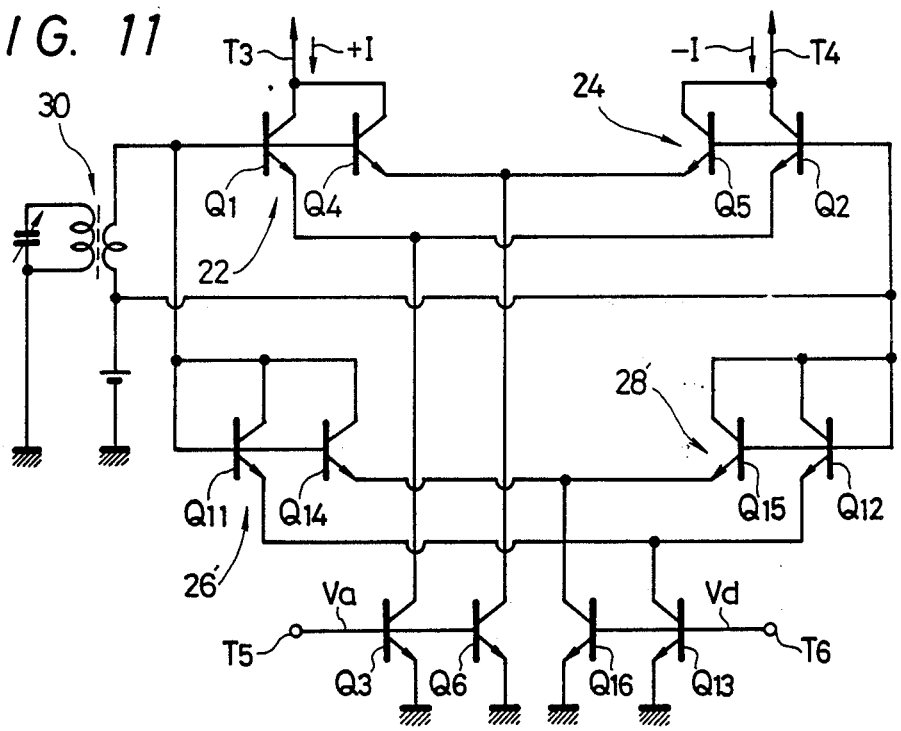
FIG. 11 is a schematic diagram of an improved AGC circuit according to an embodiment of the present invention for solving the problems inherent in the AGC circuit shown in FIG. 9.

Since the transistors Q1, Q2, Q4, Q5 and the transistors Q11, Q12, Q14 and Q15 in the embodiment of the invention shown in FIG. 11 can satisfactorily carry out the AGC operations over a wide range of input signal amplitude, it is possible to improve the cross modulation characteristic and the spurious characteristic. Further, the linearity of the AGC circuit in this embodiment is maintained even when an input signal of large amplitude is received. Moreover, the level at which the AGC is started by the AGC voltage Vd is delayed, for example, to the level $E_2$ of the input signal shown in FIG. 10, so that the noise level has the characteristic represented by the solid line in FIG. 10, making it possible to improve the S/N ratio. Furthermore, if the AGC range controlled by the AGC voltage Va is used for an input signal of small amplitude and the AGC range controlled by the AGC voltage Vd is used for an input signal of large amplitude, it is possible to carry out the AGC operation over a wide range.

Figure 12:
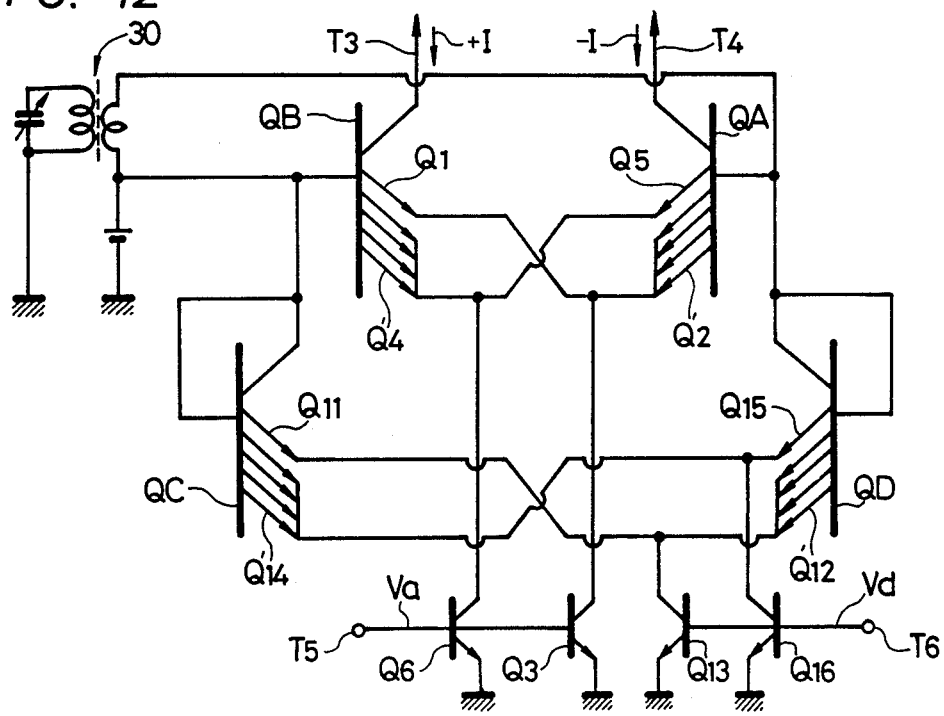
FIG. 12 is a schematic diagram showing an AGC circuit according to another embodiment of the present invention.

FIG. 12 shows a further AGC circuit according to an embodiment of this invention, and in which the concept of FIG. 7 is applied to the AGC circuit shown in FIG. 11.

As shown in FIG. 12, five emitter regions of the same size are formed in each of the base regions of transistors QA, QB, QC and QD. Four of the five emitter regions of the transistors QA, QB, QC and QD are connected together to form the transistors Q'2, Q'4, Q'14 and Q'12. The single remaining emitter regions of the transistors QA, QB, QC and QD are extended to form the transistors Q5, Q1, Q11 and Q15, respectively.

In the embodiments of FIGS. 11 and 12, when the AGC voltage Va is fixed, the AGC operation may not be carried out. Further, it is possible that, when Va equals Vd, the starting levels of both AGC operations are made equal.

In the above described embodiments of the present invention, because the differential amplifiers 22 and 24, 22A and 24A, 22B and 24B, and 22C and 24C are connected in parallel to each other and the ratio between the collector currents of transistors Q1 and Q2 and the ratio between the collector currents of transistors Q5 and Q4 (as well as the ratio between the collector currents of transistors Q11 and Q12 and between the collector currents of transistors Q15 and Q14) are selected as a predetermined ratio N (or n), it is possible to improve the distortion characteristic considerably, as shown in FIGS. 3 and 4. Because the absolute amount of collector current is not increased, it also is possible to reduce the current to be consumed. Since the operation points of the transistors Q1, Q2, Q4 and Q5 are not fluctuated upon changes in the level of the input signal, an amplifier embodying the present invention can be directly connected with a succeeding transistor and can be fabricated as an integrated circuit.

In the embodiments of FIGS. 11 and 12, the transistors Q1, Q2, Q4 and Q5 and the transistors Q11, Q12, Q14 and Q15, or the transistors Q1, Q'2, Q'4, Q5, Q11, Q'12, Q'14 and Q15, can carry out the AGC operations with a low distortion ratio over a wide input signal range from a small amplitude input signal to a large amplitude input signal. As a result, the cross modulation characteristic, the spurious characteristic and the like can be improved. Because the linearity of the amplifier circuit is maintained even when a large amplitude input signal is received, the level at which the AGC is started by the AGC voltage Vd is delayed as represented by the level $E_2$ in FIG. 10. Thus, the noise level achieves the characteristic represented by the solid line in FIG. 10, thereby improving the S/N ratio.

Furthermore, the AGC voltage Va is used for the AGC control of an input signal of small amplitude and the AGC voltage Vd is used for the AGC control of an input signal of large amplitude so that it is possible to carry out the AGC operation over a wide range.

Having described a number of preferred embodiments of the invention with reference to the accompanying drawings, it will be understood that the invention is not limited to those precise embodiments, and that many modifications and variations thereof can be effected by one with ordinary skill in the art without departing from the spirit and scope of the invention as defined in the appended claims.

What is claimed is:

1. An amplifier comprising:
   first differential amplifier means including a first constant current source, and first and second transistors having respective emitters connected in common to said first constant current source;
   second differential amplifier means including a second constant current source, and third and fourth transistors having respective emitters connected in common to said second constant current source;
   said first and third transistors having bases thereof connected together and said second and fourth transistors having bases thereof connected together, and said first and third transistors having collectors thereof connected together and said second and fourth transistors having collectors thereof connected together;
   a ratio of a collector current of said first transistor to a collector current of said second transistor, and a ratio of a collector current of said fourth transistor to a collector current of said third transistor being each selected to be 1:N, wherein N is between approximately 2.5 and 6;
   means for applying an input signal voltage at the bases of said first and third transistors and at the bases of said second and fourth transistors; and
   means for deriving one output signal current from at least one of the collectors of said first and third transistors and another output signal current from at least one of the collectors of said second and fourth transistors.

2. An amplifier as in claim 1; wherein N is approximately $2+3^{\frac{1}{2}}$.

3. An amplifier as in claim 1; wherein each of said second and third transistors is constituted by four transistor elements connected in parallel with each other and each having the same characteristic as each of said first and fourth transistors.

4. An amplifier as in claim 1; wherein each of said second and third transistors has four emitter regions each being of the same size as an emitter region of each of said first and fourth transistors, with said four emitter regions of said second transistor being connected together and said four emitter regions of said third transistor being also connected together.

5. An amplifier as in claim 4; wherein said emitter regions of said first and third transistors are formed on a common base region, and said emitter regions of said second and fourth transistors are formed on another common base region.

6. An amplifier comprising:

first differential amplifier means including a first constant current source, and first and second transistors having respective emitters connected in common to said first constant current source;

second differential amplifier means connected in parallel with said first differential amplifier means and including a second constant current source, and third and fourth transistors having respective emitters connected in common to said second constant current source;

a third constant current source;

fifth and sixth transistors having respective emitters connected in common to said third constant current source;

a fourth constant current source;

seventh and eighth transistors having respective emitters connected in common to said fourth constant current source;

said fifth and seventh transistors having bases and collectors connected in common to said bases of said first and third transistors, and said sixth and eight transistors having bases and collectors connected in common to said bases of said second and fourth transistors;

a ratio of a collector current of said first transistor to a collector current of said second transistor, and a ratio of a collector current of said fourth transistor to a collector current of said third transistor being each selected to be 1:N, wherein N is between approximately 2.5 and 6;

a ratio of a collector current of said fifth transistor to a collector current of said sixth transistor, and a ratio of a collector current of said eighth transistor to a collector current of said seventh transistor being each selected to be 1:n, wherein n is between approximately 2.5 and 6;

means for applying an input signal voltage at the bases of said first and third transistors and at the bases of said second and fourth transistors;

means for deriving one output signal current from at least one of the collectors of said first and third transistors and another output signal current from at least one of the collectors of said second and fourth transistors; and means for controlling currents of at least said third and fourth constant current sources in accordance with an automatic gain control voltage so that the gain of each of said output signal currents is automatically controlled in accordance with said automatic gain control voltage.

7. An amplifier as in claim 6; wherein $N = n$.

8. An amplifier as in claim 7; wherein each of said $N$ and $n$ has a value of approximately $2 + 3^{\frac{1}{2}}$.

9. An amplifier as in claim 6; wherein said first and third transistors have bases which are connected together and said second and fourth transistors have bases which are connected together; and said first and third transistors have collectors which are connected together and said second and fourth transistors have collectors which are connected together.

10. An amplifier as in claim 6; wherein each of said second and third transistors has four emitter regions each being of the same size as an emitter region of each of said first and fourth transistors, with said four emitter regions of said second transistor being connected together and said four emitter regions of said third transistor being also connected together.

11. An amplifier as in claim 10; wherein said emitter regions of said first and third transistors are formed on a common base region, and said emitter regions of said second and fourth transistors are formed on another common base region.

* * * * *